(12) United States Patent
Gao (10) Patent No.: US 9,070,848 B2
(45) Date of Patent: Jun. 30, 2015

(54) ARRAY SUBSTRATE AND LIQUID CRYSTAL DISPLAY (71) Applicant: Beijing BOE Optoelectronics Technology Co., Ltd., Beijing (CN)

(72) Inventor: Xuesong Gao, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/017,692

(22) Filed: Sep. 4, 2013

(65) Prior Publication Data
US 2014/0002766 A1 Jan. 2, 2014

Related U.S. Application Data (62) Division of application No. 12/702,495, filed on Feb. 9, 2010, now Pat. No. 8,553,184.

(30) Foreign Application Priority Data

Feb. 18, 2009 (CN) .......................... 2009 1 0077351

(51) Int. Cl.
G02F 1/1335 (2006.01)
H01L 33/60 (2010.01)
(Continued)

(52) U.S. Cl.
CPC .......... H01L 33/60 (2013.01); G02F 1/133553 (2013.01); G02F 1/133555 (2013.01); G02F 1/1362 (2013.01); H01L 27/124 (2013.01); H01L 27/1288 (2013.01)

(58) Field of Classification Search
CPC ..................... G02F 1/133553; G02F 1/133555

USPC .................................................. 349/113–114
See application file for complete search history.

(56) References Cited

U.S. PATENT DOCUMENTS 6,208,395 B1 * 3/2001 Kanoh et al. ................... 349/113
7,248,307 B2 * 7/2007 Han ................................ 349/58
(Continued)

FOREIGN PATENT DOCUMENTS

CN 1525224 A 9/2004
CN 1991470 A 7/2007
(Continued)

OTHER PUBLICATIONS

USPTO RR dated Mar. 20, 2012 in connection with U.S. Appl. No. 12/702,495.
(Continued)

Primary Examiner — Jessica M Merlin
(74) Attorney, Agent, or Firm — Ladas & Parry LLP (57) ABSTRACT An array substrate, comprising a substrate and a data line and a gate line formed on the substrate. The data line and gate line cross each other to define a pixel region and the pixel region comprises a reflective region and a transparent region. The pixel region further comprises: a pixel electrode, formed with a transparent conductive film on the substrate and provided at least in the transparent region; a thin film transistor, formed on the substrate, the transparent conductive film being retained below the gate line and a gate electrode of the thin film transistor; a planarization film, covering the thin film transistor on the substrate; and a reflective layer, formed on the planarization film and disposed in the reflective region of the pixel region. A method of manufacturing the array substrate is provided.

13 Claims, 8 Drawing Sheets (51) Int. Cl.
*H01L 27/12* (2006.01)
*G02F 1/1362* (2006.01)

(56) References Cited

U.S. PATENT DOCUMENTS

| | | |
|---|---|---|
| 2003/0053016 A1 | 3/2003 | Kubota et al. |
| 2004/0179157 A1 | 9/2004 | Kim et al. |
| 2005/0270452 A1* | 12/2005 | Ahn et al. .............. 349/114 |
| 2006/0139552 A1 | 6/2006 | Ahn |
| 2006/0290866 A1 | 12/2006 | Choi et al. |
| 2007/0058117 A1* | 3/2007 | Chien .............. 349/114 |
| 2007/0166859 A1 | 7/2007 | Lee et al. |
| 2007/0166894 A1 | 7/2007 | Lim |
| 2007/0195240 A1* | 8/2007 | Han et al. .............. 349/114 |
| 2008/0143939 A1* | 6/2008 | Adachi et al. .............. 349/114 |
| 2011/0013127 A1* | 1/2011 | Takahashi .............. 349/112 |

FOREIGN PATENT DOCUMENTS

| | | | |
|---|---|---|---|
| CN | 1992236 A | 7/2007 | |
| EP | 1 804 290 A1 | 7/2007 | |
| JP | 2004198606 A * | 7/2004 | ............ G02F 1/1335 |

OTHER PUBLICATIONS

USPTO NFOA dated Jul. 13, 2012 in connection with U.S. Appl. No. 12/702,495.

USPTO FOA dated Nov. 7, 2012 in connection with U.S. Appl. No. 12/702,495.

USPTO NFOA dated Mar. 15, 2013 in connection with U.S. Appl. No. 12/702,495.

USPTO NOA mailed Jun. 28, 2013 in connection with U.S. Appl. No. 12/702,495.

* cited by examiner

ARRAY SUBSTRATE AND LIQUID CRYSTAL DISPLAY

BACKGROUND

The invention relates to an array substrate, a manufacturing method of the array substrate, and a liquid crystal display.

The Liquid crystal display (LCD) is an ultra-thin planar display apparatus. A liquid crystal panel generally constitutes of a color filter substrate and an array substrate, bonded together with a liquid crystal layer sealed in-between. The array substrate is also named thin film transistor (TFT) array substrate, comprising a substrate of a glass material. The substrate is provided with gate lines and data lines, crossing with each other. The adjacent gate lines and data lines define pixel regions, each comprising components such as a TFT device, a common electrode, and a pixel electrode.

As a liquid crystal molecular itself does not emit light, a LCD requires a light source for image displaying. A LCD can be categorized as a transmissive type, a reflective type, or a transreflective type, based on the way using the light source and the structure of the array substrate.

The transmissive type TFT-LCD employs a backlight as the light source, disposed behind the liquid crystal panel. The pixel electrode on the array substrate is a transparent electrode, used as a transparent region, amicable for light from the backlight to transmit through the liquid crystal layer to display images. The reflective type TFT-LCD employs a front light or an exterior light as the light source. A pixel electrode of metal or other materials with excellent reflective properties is disposed on the array substrate as a reflective region, suitable for reflecting the light from the front light or the exterior light. The transreflective type TFT-LCD can be deemed as a combination of the transmissive type LCD and the reflective type LCD, where both the reflective region and the transmissive region are disposed on the array substrate, and both the backlight and the exterior light are used for image displaying.

The transmissive type LCD has an advantage of being able to display a bright image in a dark environment; nevertheless, it has the disadvantage that only a low percentage of light from the backlight is transmitted, meaning a low utilization rate of the backlight. Improving the display luminance demands significantly raising the luminance of the backlight, necessitating high energy consumption. The reflective type LCD has the advantage of being able to use sun light or man-made light as the light source of LCD, and thus has relatively low energy consumption; it, however, can not display an image in a dark environment, due to the dependency on an exterior light.

Figure 1:
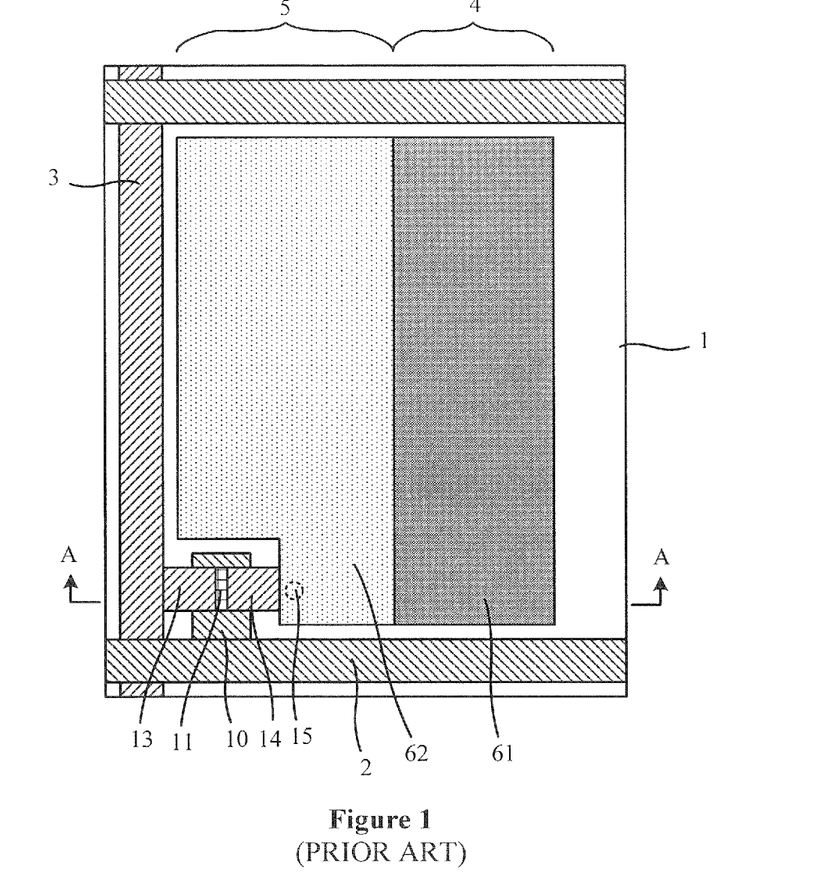
FIG. 1 is a top view of one pixel region in a transreflective TFT-LCD in prior art.
Figure 2:
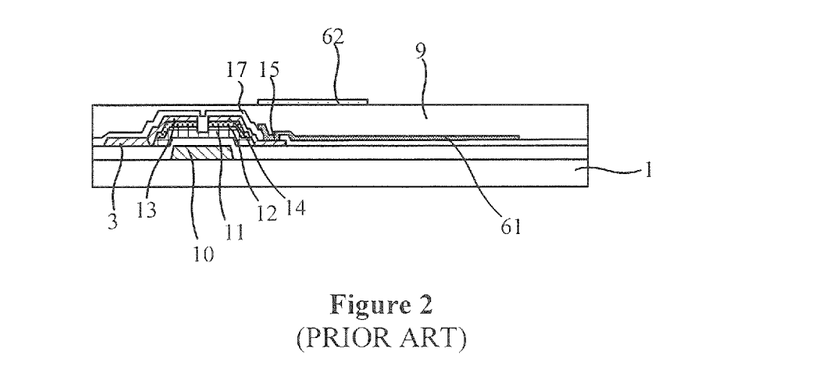
FIG. 2 is a cross-sectional view taken along line A-A in FIG. 1.

The transreflective type LCD combines the structure of the transmissive type and the reflective type LCD, and thus can be used in either the transmissive or the reflective mode. FIG. 1 is a top view, showing the schematic configuration of one pixel region in a transreflective TFT-LCD, while FIG. 2 is a cross-sectional view taken from line A-A of FIG. 1. The manufacturing method for the transreflective TFT-LCD in prior art generally comprises steps of: first, forming, with a patterning process, a gate electrode 10, a gate line 2, a semiconductor layer 11 and a doped semiconductor layer 12, a source electrode 13, a drain electrode 14, and a data line 3 on a substrate 1, wherein, the source electrode 13 and the drain electrode 14 are located above and insulated from the gate electrode 10; forming a passivation layer 17 to cover the gate electrode 10, the source electrode 13, and the drain electrode 14; forming a though hole 15 that extends all the way through the passivation layer 17 above the source electrode 14 with a patterning process; forming a transmissive region electrode 61 at a position corresponding to a transmissive region 4 and above the passivation layer 17 with a patterning process; and forming a reflective region electrode 62 at the position corresponding to a reflective region 5 and on the passivation layer 17 with a patterning process.

In the process aforementioned, each patterning process comprises steps of forming a film, applying a photoresist layer, exposing, developing, etching, removing the photoresist, cleaning, and etc. In the manufacturing process of a TFT-LCD, each patterning process suffers the chance of micro contamination, which adversely influences the qualification ratio of the products. Further, each patterning process cost a large amount of time, labor, and equipment investment. Therefore, the transreflective liquid crystal display has the disadvantages of complex manufacturing procedures, low utilization rate, low qualification ratio, significant chance of contamination, and large amount of labor, time, and equipment investment.

SUMMARY

A method of manufacturing an array substrate is provided in an embodiment of the present invention, comprising: step 100, depositing a transparent conductive film and a gate metal film on a substrate, and forming a pixel electrode, a gate electrode, and a gate line with a first patterning process; step 200, depositing, successively, a gate insulating film, a semiconductor film, and a doped semiconductor film on the substrate after step 100, and forming a semiconductor layer and a doped semiconductor layer with a second patterning process; step 300, depositing a source/drain metal film on the substrate after step 200, and forming a data line, a source electrode, and a drain electrode with a third patterning process, the source electrode being electrically connected with the data line, and the drain electrode being electrically connected with the pixel electrode; and step 400, forming a planarization film on the substrate after step 300, depositing a reflective layer film on the planarization film and forming a reflective layer with a fourth patterning process, the reflective layer being disposed in a reflective region in a pixel region defined by crossing of the gate line and the data line.

Another embodiment of the invention provides an array substrate, comprising a substrate and a data line and a gate line formed on the substrate. The data line and gate line cross each other to define a pixel region and the pixel region comprises a reflective region and a transparent region. The pixel region further comprises: a pixel electrode, formed with a transparent conductive film on the substrate and provided at least in the transparent region; a thin film transistor, formed on the substrate, the transparent conductive film being retained below the gate line and a gate electrode of the thin film transistor; a planarization film, covering the thin film transistor on the substrate; and a reflective layer, formed on the planarization film and disposed in the reflective region of the pixel region.

A liquid crystal display is further provided in an embodiment of the present invention. The liquid crystal display comprises an array substrate as above mentioned; a color filter substrate, bonded together with the array substrate so as to form a liquid crystal panel, with a liquid crystal layer sealed between the color filter substrate and the array substrate; a backlight, disposed on a side of the liquid crystal panel that is adjacent to the array substrate; and a frame in which the liquid crystal panel and the backlight are positioned.

A further scope of the invention will become apparent from the detailed description given hereinafter. However, it is understood that the detailed description and specific examples, while indicating preferred embodiments of the invention, are given with way of illustration only, since various changes and modifications within the spirit and scope of the invention will become apparent to those skilled in the art.

DESCRIPTION OF THE EMBODIMENTS

Hereinafter, embodiments of the invention will be described in detail with reference to the embodiments and the accompanying drawings.

A First Embodiment of a Manufacturing Method of an Array Substrate

Figure 3:
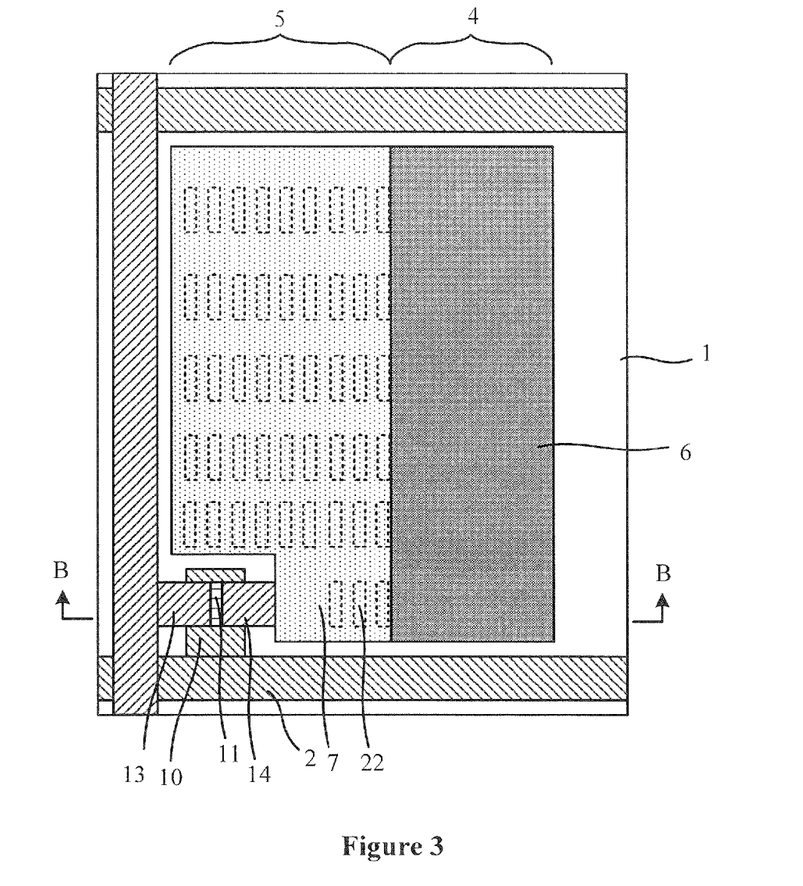
FIG. 3 is a top view of one pixel region in the array substrate manufactured according to the manufacturing method of an array substrate in the first embodiment of the invention.
Figure 4:
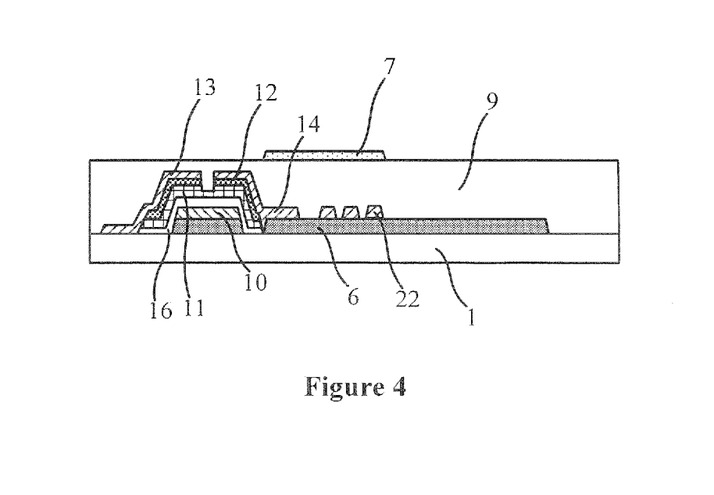
FIG. 4 is a cross-sectional view taken along line B-B in FIG. 3.

The present embodiment of the invention is a manufacturing method of an array substrate in a transreflective type liquid crystal display. FIG. 3 is a top view of one pixel region in an array substrate manufactured according to the manufacturing method of an array substrate in the first embodiment of the invention, while FIG. 4 is a cross-sectional view taken along line B-B in FIG. 3. The method comprises the following steps.

Step 100, depositing a transparent conductive film and a gate metal film on a substrate 1, and forming a pixel electrode 6, a gate electrode 10, and a gate line 2 with a patterning process. The gate electrode 10 uses the same material as the gate line 2. The pixel electrode 6 corresponds to an electrode of a transmissive region. The pixel electrode 6 is formed in a reflective region 5 and a transmissive region 4. Alternatively, the pixel electrode 6 may be formed only in the transmissive region 4; in such case, the positions of the transmissive region 4 and the reflective region 5 can be interchanged, so that the transmissive region 4 lies adjacent to the TFT device of the pixel region, amicable for the pixel electrode 6 to connect with a drain electrode 14. Alternatively, the connection between the drain electrode 14 and the pixel electrode 6 may be secured with other means.

Step 200, depositing, successively, a gate insulating film, a semiconductor film, and a doped semiconductor film on the substrate 1 after step 100, and forming a semiconductor layer 11 and a doped semiconductor layer 12 with a patterning process.

Step 300, depositing a source/drain metal film on the substrate 1 after step 200, and forming a data line 3, a source electrode 13, and a drain electrode 14 with a patterning process. The source electrode 13 and the data line 3 are made with the same material and are electrically connected with each other, and the drain electrode 14 is electrically connected with the pixel electrode 6.

Step 400, forming a planarization film 9 on the substrate 1 after step 300, depositing a reflective layer film on the planarization film 9, and forming a reflective layer 7 with a patterning process. The reflective layer 7 is disposed in the reflective region 5 and corresponds to the electrode in the reflective region.

To improve utilization rate of a backlight, when forming the data line 3, the source electrode 13, and the drain electrode 14 with a patterning process, the method may also comprise the following steps.

Forming a reflective structure 22 through etching the source/drain metal film in the reflective region 5. The reflective structure 22 is preferably disposed adjacent to the TFT device.

With the present embodiment, the array substrate of the transreflective liquid crystal display can be manufactured using a 4-mask process, which decreases the masking times, simplifies the manufacturing procedure, and reduces complexity of the process, and thus improves the productivity and lowers the cost. In addition, the number of manufacturing steps is decreased, which reduces the chance of micro contamination of the array substrate and improves the qualification ratio of the products.

A Second Embodiment of a Manufacturing Method of an Array Substrate

The present embodiment is based on the first embodiment. In the method, the step 100 is performed with steps as follows.

Step 110, depositing a transparent conductive film and a gate metal film on the substrate 1, for example, with sputtering, so as to form a stack of films. The transparent conductive film may be made of transparent conductive materials, such as Indium Tin Oxides (ITO).

In the step 100, the pixel electrode 6, the gate electrode 10, and the gate line 2 may be formed in such way where a grey tone or a half-tone mask is used for the patterning process, the gate electrode 10 and the gate line 2 are formed in a first etching process, and the pixel electrode 6 is formed in a second etching process. The step may comprise sub-steps as follows.

Step 120, applying photoresist on the gate metal film. In the description to follow, the patterning process in the embodiment of the invention may comprise the processes such as applying photoresist, masking, exposing and developing the photoresist to form a photoresist pattern, etching with the photoresist pattern, and peeling off the photoresist pattern, and a positive photoresist is taken as an example of the photoresist.

Step 130, exposing and developing the photoresist using the grey tone mask or the half-tone mask, so that the photoresist is formed into a photoresist-completely-removed region 19, a photoresist-partially-retained region 20, and a photoresist-completely-retained region 21.

Step 140, etching away the transparent conductive film and the gate metal film in the photoresist-completely-removed region 19 with a first etching process, so as to form the gate electrode 10 and the gate line 2.

Step 150, removing the photoresist in the photoresist-partially-retained region 20 with an ashing process, and partially removing the photoresist in the photoresist-completely-retained region 21 in the thickness direction with the ashing process.

Figure 5:
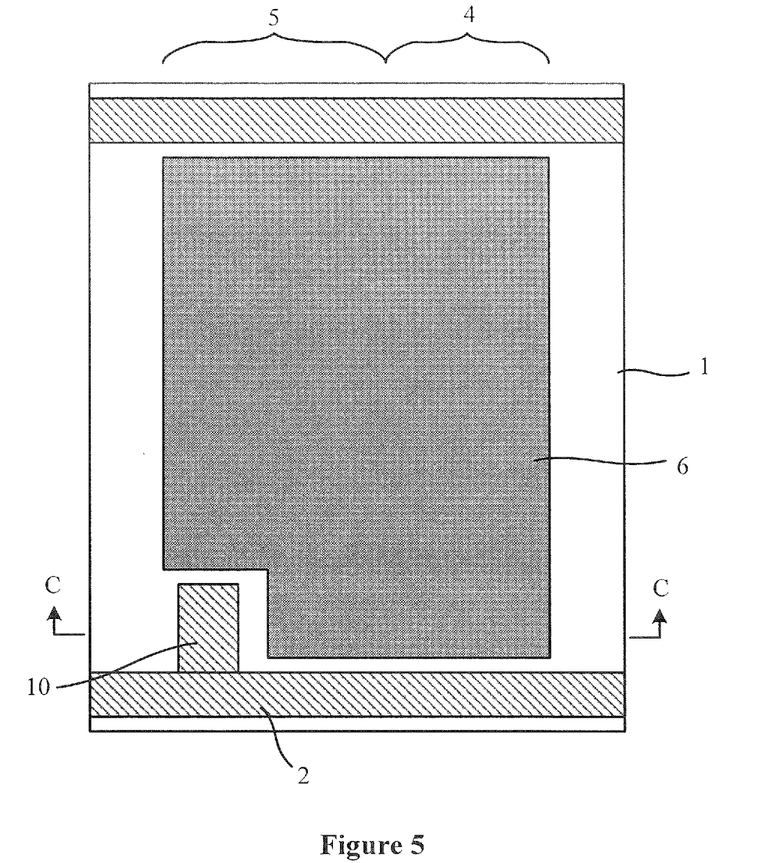
FIG. 5 is a top view of one pixel region in the array substrate manufactured according to the manufacturing method of an array substrate in the second embodiment of the invention.
Figure 6:
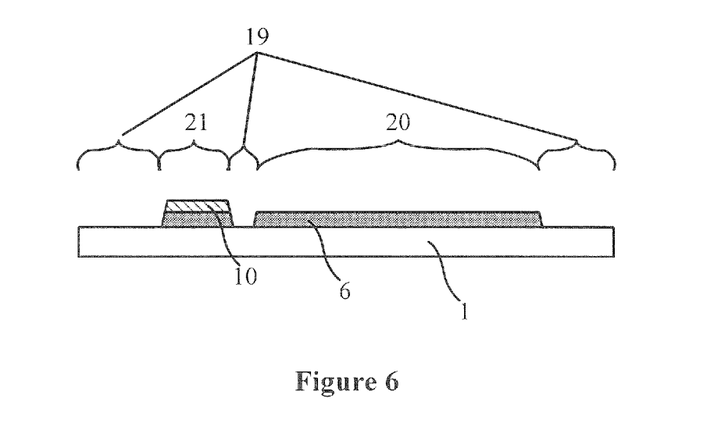
FIG. 6 is a cross-sectional view taken along line C-C in FIG. 5.

Step 160, etching away the gate metal film in the photoresist-partially-retained region 20 with a second etching process, so as to form the pixel electrode 6 in the photoresist-partially-retained region 20, as shown in FIG. 5. FIG. 6 is a cross-sectional view taken along line C-C in FIG. 5.

The step 200 may comprise sub-steps as follows.

Step 210, depositing, successively, a gate insulating film, a semiconductor film, and a doped semiconductor film on the substrate 1 after the step 100, for example, with Chemical Vapor Deposition (CVD). The gate insulating film may be silicon oxide, silicon nitride, or silicon oxynitride, the semiconductor film may be amorphous silicon, and the doped semiconductor may be N+ amorphous silicon.

The semiconductor layer 11 and the doped semiconductor film 12 may be formed with the patterning process as follows.

Figure 7:
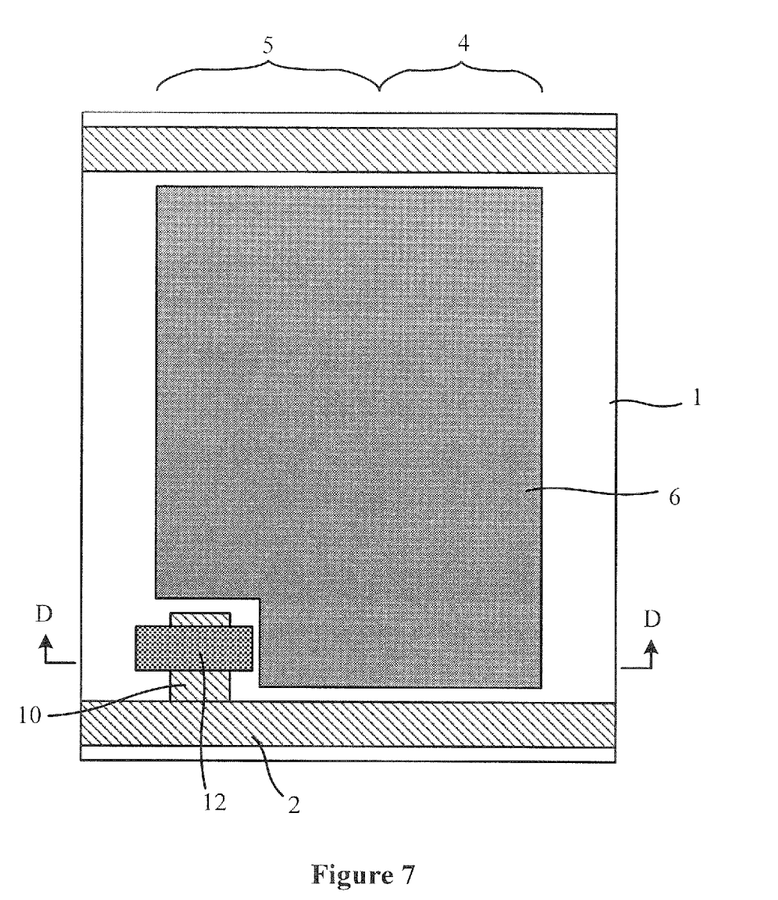
FIG. 7 another top view of one pixel region in the array substrate manufactured according to the manufacturing method of an array substrate in the second embodiment of the invention.
Figure 8:
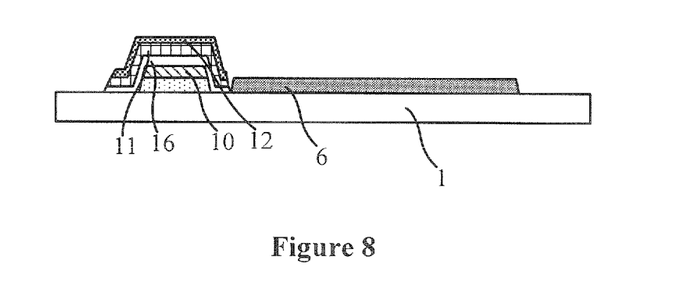
FIG. 8 is a cross-sectional view taken along line D-D in FIG. 7.

Step 220a, etching the semiconductor film, the doped semiconductor film and the gate insulating film with a patterning process, so as to form the semiconductor layer 11 and the doped semiconductor 12. In addition, etching away the gate insulating film in the region other than that covered by the semiconductor layer 11 so that the semiconductor layer 11 may be insulated from the gate electrode 10 through the gate insulating layer 16, as shown in FIG. 7. FIG. 8 is a cross-sectional view taken along the line D-D in FIG. 7.

Figure 9:
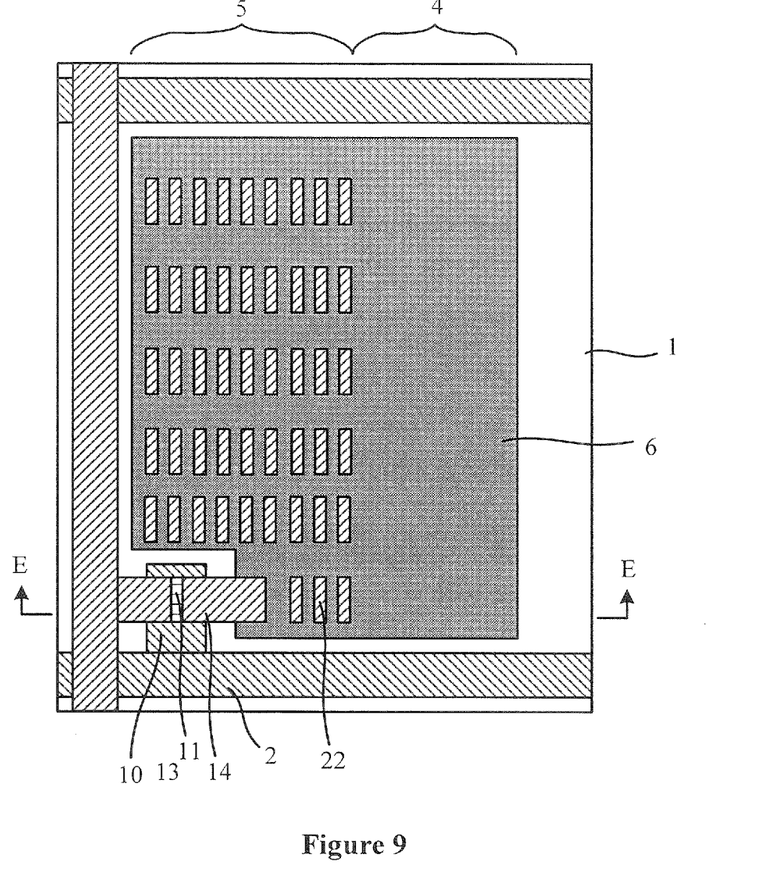
FIG. 9 is still another top view of one pixel region in the array substrate manufactured according to the manufacturing method of an array substrate in the second embodiment of the invention.
Figure 10:
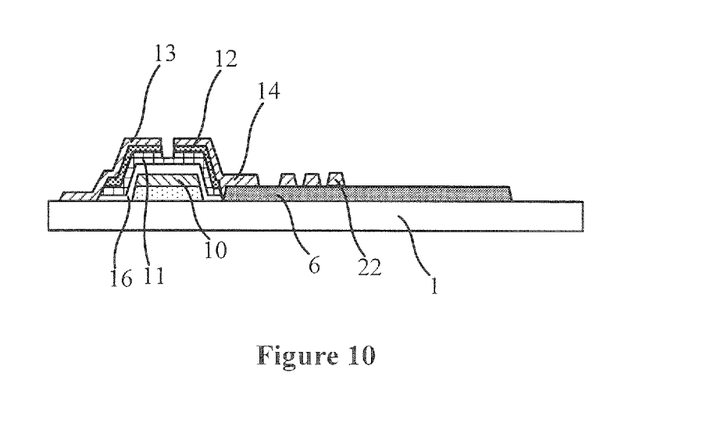
FIG. 10 is a cross-sectional view taken along line E-E in FIG. 9.

Step 300, depositing a source/drain metal film, i.e., a metal material commonly used, on the substrate 1 after the step 200, for example, with sputtering, and etching the source/drain metal film with a patterning process so as to form a data line 3, a source electrode 13, and a drain electrode 14. The source electrode 13 is electrically connected with the data line 3, and the drain electrode 14 is electrically connected with the pixel electrode 6. In this step, the doped semiconductor layer 12 and a part of the semiconductor layer 11 between the source electrode 13 and the drain electrode 14 may be etched away so as to form a TFT groove, which may be formed through using a grey tone or a half-tone mask. Alternatively, the TFT groove may be formed with using a grey tone or a half-tone mask when the semiconductor layer 11 and the doped semiconductor layer 12 are etched in the last step. In the step 300, when the source/drain metal film is etched to form the data line, the source electrode, and the drain electrode, a reflective structure 22 may also be formed, disposed adjacent to the TFT device and located in the reflective region 5, as shown in FIG. 9. FIG. 10 is a cross-sectional view taken along line E-E;

Step 400, forming a planarization film 9 on the substrate 1 after the step 300, for example, with Chemical Vapor Deposition. A reflective film may be deposited on the planarization film 9 and a reflective layer 7 is formed by etching the reflective film through a patterning process. The pattern of the reflective layer 7 lies in the reflective region 5, as shown in FIGS. 3 and 4.

With the present embodiment, the array substrate of the transreflective liquid crystal display can be manufactured using a 4-mask process, which decreases the masking times, simplifies the manufacturing procedure, and reduces complexity of the process, and thus improves the productivity and lowers the cost. In addition, the number of manufacturing steps is decreased, which reduces the chance of micro contamination of the array substrate and improves the qualification ratio of the products. Furthermore, a reflective structure with a plurality of bumps is provided in the reflective region, which causes the light from the backlight to be reflected between the reflective structure and the reflective layer, and to eventually exit the transmissive region, thus effectively improving the utilization rate of the backlight.

A Third Embodiment of a Manufacturing Method of an Array Substrate

The embodiment is based on the first embodiment and is similar to the second embodiment, while differing from the second embodiment in that the gate insulating film in the region other than the semiconductor layer 11 is not completely etched away, but etched to form a through hole 15. The step 200 comprises sub-steps as follows.

Step 210, depositing, successively, a gate insulating film, a semiconductor film, and a doped semiconductor film on the substrate 1 after the step 100.

Figure 11:
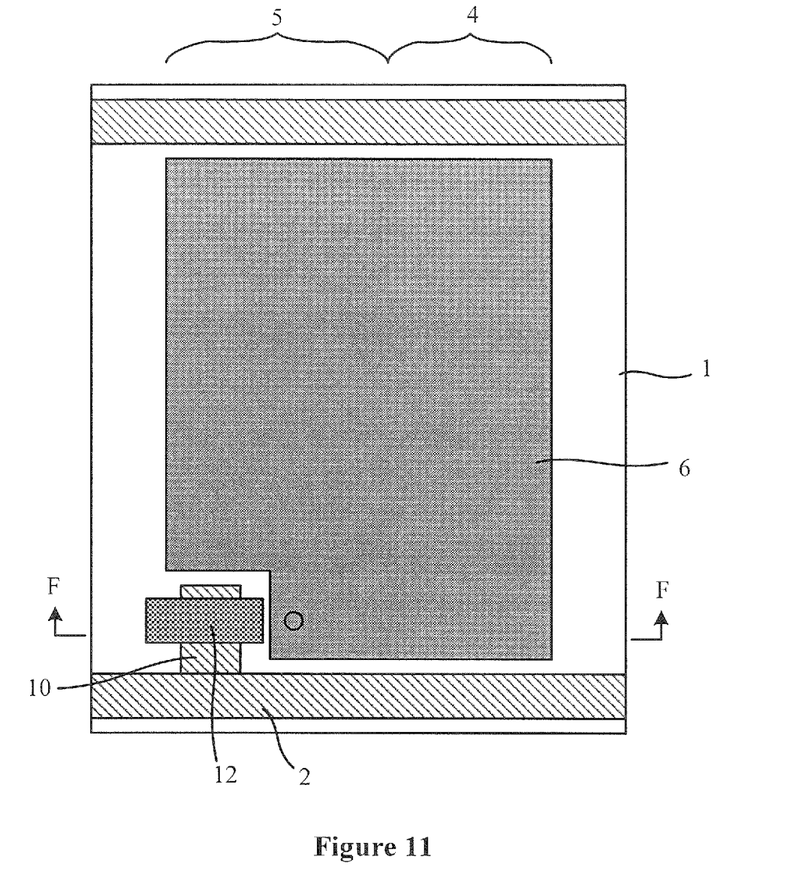
FIG. 11 is a top view of one pixel region in the array substrate manufactured according to the manufacturing method of an array substrate in the third embodiment of the invention.
Figure 12:
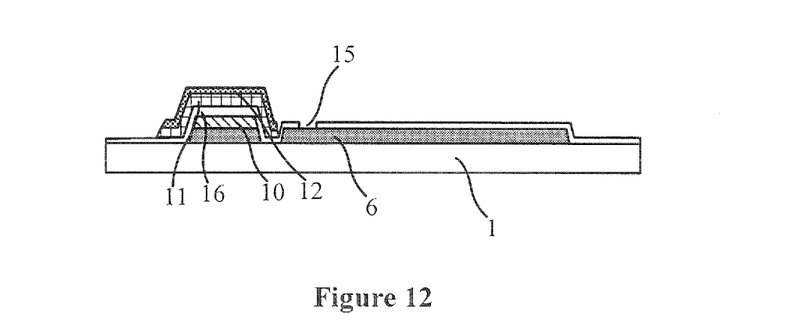
FIG. 12 is a cross-sectional view taken along line F-F in FIG. 11.

Step 220b, using a grey tone or half-tone mask to perform the patterning process, so as to form the semiconductor layer 11 and the doped semiconductor layer 12 in a first etching process and form a through hole 15 in the gate insulating layer above the pixel electrode 6 in a second etching process, as shown in FIG. 11. FIG. 12 is a cross-sectional view taken along line F-F in FIG. 3.

Figure 13:
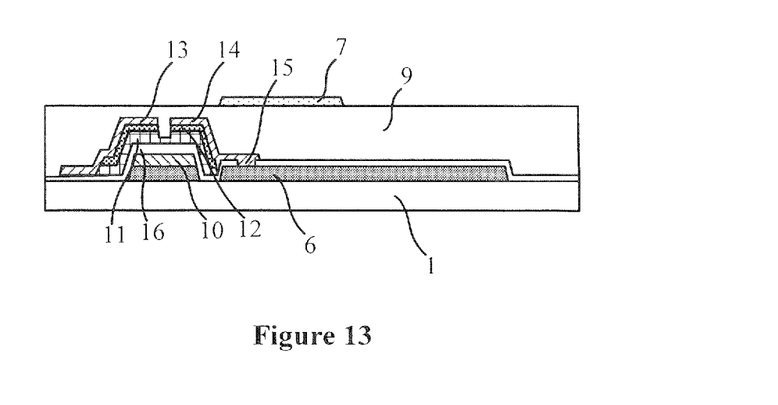
FIG. 13 is another top view of one pixel region in the array substrate manufactured according to the manufacturing method of an array substrate in the third embodiment of the invention.

In the subsequent steps, when the data line 3, the source electrode 13 and the drain electrode 14 are formed through etching, the source electrode 13 and the data line 3 are electrically connected with each other, and the drain electrode 14 is electrically connected with the pixel electrode 6 via the through hole 15. Another difference between the present embodiment and the above embodiments is that the reflective structure is not formed in the present embodiment. The array substrate of the embodiment after completing the manufacturing process is shown in FIG. 13.

With the present embodiment, the array substrate of the transreflective liquid crystal display can be manufactured using a 4-mask process, which simplifies the manufacturing procedures, improves the productivity, lowers the cost of labor, time, and equipment investment, reduces the chance of micro contamination, and improves the qualification ratio of the products.

A Fourth Embodiment of a Manufacturing Method of an Array Substrate

The present embodiment is based on the second embodiment, while differing from the second embodiment in that the patterning of the pixel electrode 6 is not performed until after step 100 and step 200. Step 100 and the step 200 may comprise sub-steps as follows.

Figure 14:
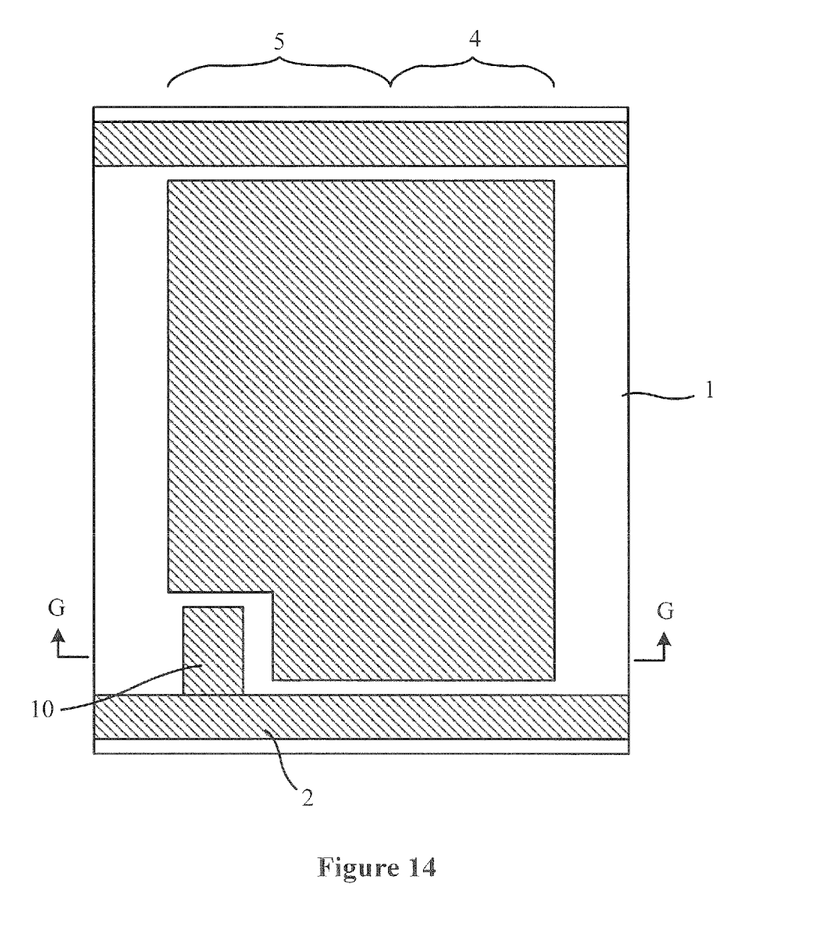
FIG. 14 is a top view of one pixel region in the array substrate manufactured according to the manufacturing method of an array substrate in the fourth embodiment of the invention.
Figure 15:
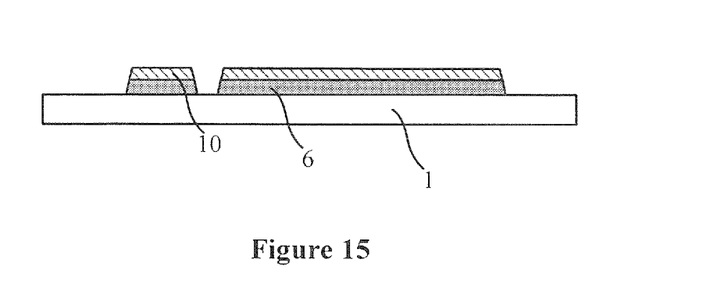
FIG. 15 is a cross-sectional view taken along line G-G in FIG. 14.

In the step 100, depositing a transparent conductive film and a gate metal film on a substrate 1, and etching away the transparent conductive film and the gate metal film in the region other than those covered by the pixel electrode, the gate electrode, and the gate line with the patterning process in a lump, as shown in FIG. 14. FIG. 15 is a cross-sectional view taken along line G-G in FIG. 14.

Step 210, depositing, successively, a gate insulating film, a semiconductor film, and a doped semiconductor film on the substrate 1 after the step 100.

Step 220a, forming a semiconductor layer 11 and a doped semiconductor layer 12 through etching the semiconductor film and the doped semiconductor film with a patterning process.

Step 230a, etching away the part of the gate metal film above the pixel electrode 6 with a wet etching process, and forming a pixel electrode 6 is formed, as shown in FIG. 7 and FIG. 8.

With the present embodiment, the array substrate of the transreflective liquid crystal display can be manufactured using a 4-mask process, which simplifies the manufacturing procedures, improves the productivity, lowers the cost of labor, time, and equipment investment, reduces the chance of micro contamination, and improves the qualification ratio of the products.

In the above embodiments of the invention, the planarization film made of proper materials can replace a passivation layer and the protection film, which further simplifies the process and lowers the cost.

A Fifth Embodiment of a Manufacturing Method of an Array Substrate

The present embodiment is based on the above embodiments, further comprising a step of forming a pad area 23 at the edge of the substrate 1. The step comprises the following sub-steps.

Step 100', when the pixel electrode 6 and the gate electrode 10 are formed, the transparent conductive film, or the transparent conductive film and the gate metal film, is retained in the pad area. That is to say, either the material of the pixel electrode 6 is retained, or the materials of the pixel electrode 6 and the gate electrode 10 are retained.

Step 200', when the gate insulating layer 16, the semiconductor layer 11, and the doped semiconductor layer 12 are formed, the gate insulating film, the semiconductor film, and the doped semiconductor film, which are used to from, respectively, the gate insulating layer 16, the semiconductor layer 11, and the doped semiconductor layer 12 are retained in the pad area 23, and are etched to form a connection through hole 24.

Step 300', when the drain electrode 14 is formed, the source/drain metal film is retained in the pad area 23, and is connected with the materials of the pixel electrode 6 or the gate electrode 10 through the connection through hole 24.

Figure 16:
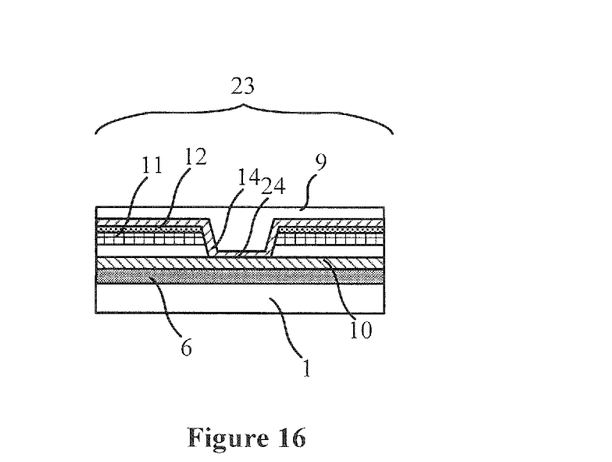
FIG. 16 is a cross-sectional view of a pad area of the array substrate manufactured according to the manufacturing method of an array substrate in the fifth embodiment of the invention.

Step 400', when the planarization film 14 is formed, the planarization film 9 is also formed in the pad area, as shown in FIG. 16.

Figure 17:
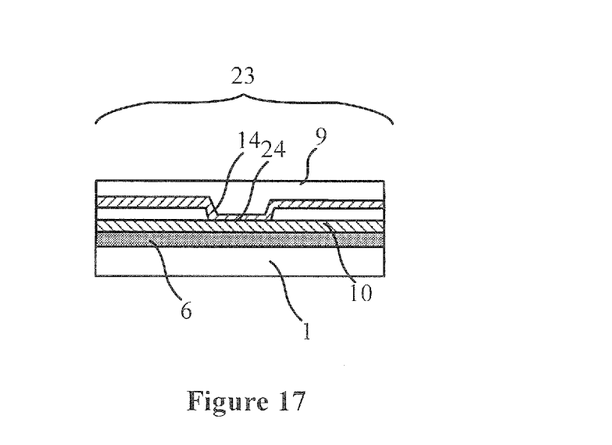
FIG. 17 is another cross-sectional view of a pad area of the array substrate manufactured according to the manufacturing method of an array substrate in the fifth embodiment of the invention.

Alternatively, the step 200' may be formed as follows. Only the gate insulating film used for forming the gate insulating layer 16 is retained, and the semiconductor film and the doped semiconductor film used for forming the semiconductor 11 and the doped semiconductor layer 12 are etched away, as shown in FIG. 17, and the connection through hole 24 is formed with etching the gate insulating film.

According to the present embodiment, the pad area may be formed simultaneously along with the various layers on the array substrate, which procedure is simple and easy to implement.

A Embodiment of the Array Substrate

The array substrate structure of the present embodiment is shown in FIGS. 3 and 4. The array substrate comprise a substrate 1, on which data lines 3 and gate lines 2 are formed, crossing each other to define pixel regions. Pixel regions corresponding to the crossing of the data lines and gate lines are arranged in matrix. At least some of the pixel regions each comprise a reflective region 5 and a transparent region 4, and each of these pixel regions comprises: a pixel electrode 6, formed with a transparent conductive film on the substrate 1 and provided at least in the transparent region 4, preferably in transparent region 4 and the reflective region 5; a thin film transistor, formed in the substrate 1, which is formed with the pixel electrode 6, and the transparent conductive film is retained below the gate line and a gate electrode of the thin film transistor; a planarization film 9, covering the thin film transistor on the substrate 1; a reflective layer 7, formed on the planarization film 9 and disposed in the reflective region 5. Specifically, the thin film transistor may comprise the gate electrode 10, a semiconductor layer 11, a doped semiconductor layer 12, a source electrode 13, a drain electrode 14, and a gate insulating layer 16 provided on the gate electrode 10. The gate insulating layer 16 has the same pattern with that of the semiconductor layer 11, or the gate insulating layer 16 covers the gate electrode and the pixel electrode and a though hole 15 may be formed in the gate insulating layer 16 above the pixel electrode at a position corresponding to the drain electrode 14, so long as the electrical connection between drain electrode 14 and the pixel electrode 6 is assured.

To efficiently utilize the light emitted from the backlight, a reflective structure 22 may be provided. In the case where the pixel electrode 6 is provided in both the reflective region 5 and the transmissive region 4, the reflective structure 22 is disposed on the pixel electrode 6 and in the reflective region 5 at the position below the reflective layer 7. The reflective structure 22 is preferably disposed adjacent to the thin film transistor. The reflective structure 22 may be formed simultaneously along with the drain electrode 13 and the drain electrode 14 with the source/drain metal film. The surface of the reflective structure 22 may has a sawtooth shape, or the reflective structure 22 may comprises one or more bumps. The main function of the reflective structure 22 is to cooperate with the lower surface of the reflective layer 7, causing the light from the back to be reflected repeatedly until exiting the transmissive region, thus improving the utilization rate of the backlight.

A pad area 23 may be further provided in an edge portion of the substrate in the embodiment of the invention, as shown in FIG. 17. The pad area 23 comprises: the transparent conductive film, or a stack of the transparent conductive layer and the gate metal film formed on the substrate, the transparent conductive film being that used to form the pixel electrode 6 and the gate metal film being used to form the gate electrode 10; the gate insulating film, which is used to form the gate insulating layer 16 and is formed on the transparent conductive film or the gate metal film, a connection through hole 24 being formed on the gate insulating film; the source/drain metal film, which is used to form the drain electrode 14 and is formed on the gate insulating film and connected with the transparent conductive film or the gate metal film through the through hole 24; and the planarization film 9, formed on the source/drain metal film.

The gate insulating film may be retained in the step of etching the semiconductor film and the doped semiconductor film in the pad area. In the patterning process, the semiconductor film and the doped semiconductor film may also be retained, thus a stack of the semiconductor film and the doped semiconductor film may be retained between the gate insulating film and the source/drain metal film, as shown in FIG. 16.

The array substrate in the embodiment may be manufactured with any one of the manufacturing method embodiments, which provides the pixel electrode directly on the substrate. In such way, the array substrate of the transreflective liquid crystal display can be manufactured through merely using a 4-mask process, which decreases the masking times, simplifies the manufacturing procedure, and reduces complexity of the process, and thus improves the productivity and lowers the cost. In addition, the number of manufacturing steps is decreased, which reduces the chance of micro contamination of the array substrate and improves the qualification ratio of the products.

A Embodiment of a Liquid Crystal Display

The embodiment of the liquid crystal display is a transreflective liquid crystal display, comprising an array substrate according to any one of the array substrate embodiments mentioned above. It further comprises: a color filter substrate, bonded together with the array substrate to form a liquid crystal panel with a liquid crystal layer sealed between the color filter substrate and the array substrate; a backlight disposed on a side of the liquid crystal panel that is adjacent to the array substrate; and a frame, in which the liquid crystal panel and the backlight are positioned.

The liquid crystal displayer in the embodiment has simplified manufacturing procedures, high productivity, reduced chance of micro contamination, and improved qualification ratio of the products.

It should be appreciated that the embodiments described above are intended merely to illustrate, not to limit, the invention. Although the invention has been described in detail herein with reference to the preferred embodiments, it should be understood with those skilled in the art that the invention can be modified and some of the technical features can be substituted without departing from the spirit and scope of the invention.

What is claimed is:

1. An array substrate, comprising
 a substrate, and
 a data line and a gate line that are formed on the substrate, wherein the data line and gate line cross each other to define a pixel region and the pixel region comprises a reflective region and a transparent region, and
 wherein the pixel region further comprises:
  a pixel electrode, formed with a transparent conductive film on the substrate and provided at least in the transparent region;
  a thin film transistor including a gate electrode, a drain electrode and a source electrode, the thin film transistor being formed on the substrate, the transparent conductive film being retained below the gate line and the gate electrode of the thin film transistor;
  a planarization film, covering the thin film transistor on the substrate, and having an entirely flat surface; and
  a reflective layer, directly formed on the planarization film and disposed in the reflective region of the pixel region,
  wherein the pixel region further comprises a reflective structure, and the reflective structure is formed below the reflective layer through the planarization film.

2. The array substrate according to claim 1, wherein the pixel electrode is disposed in both the reflective region and the transparent region of the pixel region.

3. The array substrate according to claim 2, wherein the reflective structure is disposed over the pixel electrode and in the reflective region.

4. The array substrate according to claim 3, wherein the reflective structure is disposed adjacent to the thin film transistor.

5. The array substrate according to claim 3, wherein the surface of the reflective structure has a sawtooth shape, or the reflective structure comprises one or more bumps.

6. The array substrate according to claim 1, wherein a gate insulating layer is formed on the gate electrode, and the gate insulating layer has the same pattern with that of the semiconductor layer.

7. The array substrate according to claim 1, wherein a gate insulating layer is formed on the gate electrode and the pixel electrode, and a through hole is formed in the gate insulating layer at a position corresponding to the drain electrode.

8. The array substrate according to claim 1, wherein a pad area is formed at an edge portion of the array substrate, comprising:
 the transparent conductive film or a stack of the transparent conductive film and a gate metal film, formed on the substrate;
 a gate insulating film, formed on the transparent conductive film or the gate metal film, a connection through hole being formed in the gate insulating film;
 a source/drain metal film formed on the gate insulating film, connected with the transparent conductive film or the gate metal film through the through hole; and
 a planarization film formed on the source/drain metal film.

9. The array substrate according to claim 7, wherein a stack of a semiconductor film and a doped semiconductor film is retained between the gate insulating film and the source/drain metal film.

10. A liquid crystal display comprising: an array substrate according to claim 1,
 wherein the liquid crystal display further comprises:
  a color filter substrate, bonded together with the array substrate so as to form a liquid crystal panel, with a liquid crystal layer sealed between the color filter substrate and the array substrate;
  a backlight, disposed on a side of the liquid crystal panel that adjacent to the array substrate; and
  a frame in which the liquid crystal panel and the backlight are positioned.

11. The array substrate according to claim 1, wherein the reflective layer is electrically isolated from the drain electrode.

12. The array substrate according to claim 1, wherein the reflective structure has a material the same as that of the source electrode and the drain electrode.

13. The array substrate according to claim 1, wherein the reflective structure is located in a same layer as the source electrode and the drain electrode.

* * * * *